(12) United States Patent
Kwon et al.

(10) Patent No.: US 10,747,448 B2
(45) Date of Patent: Aug. 18, 2020

(54) REDUCING DISTURBANCE BETWEEN ADJACENT REGIONS OF A MEMORY DEVICE

(71) Applicant: SK hynix Inc., Gyeonggi-do (KR)

(72) Inventors: Jung-Hyun Kwon, Seoul (KR); Sang-Gu Jo, Gyeonggi-do (KR); Do-Sun Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 57 days.

(21) Appl. No.: 15/598,446

(22) Filed: May 18, 2017

(65) Prior Publication Data
US 2018/0088840 A1 Mar. 29, 2018

(30) Foreign Application Priority Data
Sep. 29, 2016 (KR) .................. 10-2016-0125575

(51) Int. Cl.
- *G06F 3/06* (2006.01)
- *G11C 13/00* (2006.01)
- *G06F 1/24* (2006.01)
- *G11C 7/02* (2006.01)

(52) U.S. Cl.
CPC .............. *G06F 3/0619* (2013.01); *G06F 1/24* (2013.01); *G06F 3/065* (2013.01); *G06F 3/067* (2013.01); *G06F 3/0652* (2013.01); *G06F 3/0679* (2013.01); *G11C 13/0004* (2013.01); *G11C 13/0033* (2013.01); *G11C 13/0035* (2013.01); *G11C 7/02* (2013.01)

(58) Field of Classification Search
CPC .......... G06F 1/24; G06F 3/0619; G06F 3/067; G06F 3/0652; G06F 3/065; G06F 11/106
See application file for complete search history.

(56) References Cited

U.S. PATENT DOCUMENTS

| 7,012,835 | B2 | 3/2006 | Gonzalez et al. |
| 9,711,234 | B1 * | 7/2017 | Van Gaasbeck ... G11C 16/3431 |

FOREIGN PATENT DOCUMENTS

| KR | 1020070001871 | 1/2007 |
| KR | 1020150106132 | 9/2015 |

* cited by examiner

*Primary Examiner* — Gary W. Cygiel
(74) *Attorney, Agent, or Firm* — IP & T Group LLP

(57) ABSTRACT

A memory system includes a memory device including one or more memory blocks, and configured to store data in a plurality of pages included in each memory block through a write operation, and a memory controller configured to count an operation number of write operations performed on the memory block, check whether the write operation is performed for each of the pages, select one or more victim pages among the pages, and copy data stored in the victim pages.

10 Claims, 5 Drawing Sheets

FIG. 5

| WRITE# | 1000 | | CODE | L | L | H | H | L | L | L | L | L |
|---|---|---|---|---|---|---|---|---|---|---|---|---|
| CT | H | | PAGE# | 1 | 2 | 3 | 4 | 5 | 6 | 7 | 8 | DP |

(CASE A)

| WRITE# | 1000 | | CODE | H | H | H | H | H | H | H | H | H |
|---|---|---|---|---|---|---|---|---|---|---|---|---|
| CT | H | | PAGE# | 1 | 2 | 3 | 4 | 5 | 6 | 7 | 8 | DP |

(CASE B)

| WRITE# | <1000 | | CODE | H | H | H | H | H | H | H | H | H |
|---|---|---|---|---|---|---|---|---|---|---|---|---|
| CT | L | | PAGE# | 1 | 2 | 3 | 4 | 5 | 6 | 7 | 8 | DP |

(CASE C)

| WRITE# | 8 | | CODE | H | H | H | H | H | H | H | H | H |
|---|---|---|---|---|---|---|---|---|---|---|---|---|
| CT | L | | PAGE# | 1 | 2 | 3 | 4 | 5 | 6 | 7 | 8 | DP |

(CASE D)

REDUCING DISTURBANCE BETWEEN ADJACENT REGIONS OF A MEMORY DEVICE

CROSS-REFERENCE TO RELATED APPLICATION

This application claims priority under 35 U.S.C. §119 to Korean Patent Application No. 10-2016-0125575, filed on Sep. 29, 2016, in the Korean Intellectual Property Office, the disclosure of which is incorporated herein by reference in its entirety.

TECHNICAL FIELD

Exemplary embodiments of the present invention relate to a memory system including a nonvolatile memory device, and more particularly, to a memory system capable of reducing disturbance between adjacent regions in the nonvolatile device, and an operating method for the same.

DISCUSSION OF THE RELATED ART

Semiconductor memory devices are largely classified into a volatile memory device and a nonvolatile memory device.

The volatile memory device has high write and read speed, but loses data stored therein when power supply is cut off. Examples of the volatile memory device include a Dynamic Random Access Memory (DRAM), a Static RAM (SRAM), etc. On the other hand, the nonvolatile memory device has comparatively low rite and read speed, but retains data stored therein even when power is cut off. Therefore the nonvolatile memory device is used when there is the need for storing data which should be retained regardless of supply of power. Examples of the nonvolatile memory device include a Read Only Memory (ROM), a Mask ROM (MROM), a Programmable ROM (PROM), an Erasable Programmable ROM (EPROM), an Electrically Erasable Programmable ROM (EEPROM), a flash memory, a Phase change Random Access Memory (PCRAM), a Magnetoresistive RAM (MRAM), a Resistive RAM (RRAM), a Ferroelectric RAM (FRAM), etc.

The PCRAM, which is one type of nonvolatile memory device, includes memory cells that are formed of phase change material, for example, germanium (Ge)—antimony (Sb)—tellurium (Te), and may store data in such a way that the phase change material is changed to a crystal or amorphous phase by applying heat thereto, Nonvolatile memories such as an MRAM, a PCRAM, etc. have a data processing speed similar to that of a volatile RAM, and have characteristics in which data is retained even when power is turned off.

FIG. 1 is a diagram illustrating a Phase Change Resistor (PCR) element 4 constituting a PCRAM.

The PCR element 4 includes a top electrode 1, a bottom electrode 3, and a Phase Change Material (PCM) layer 2 disposed between the top and bottom electrodes 1 and 3. When voltage and current are applied to the electrodes 1 and 3, high temperature is induced in the PCM layer 2, so that the electrical conduction state of the PCM layer 2 is changed depending on a change in resistance. In this regard, AgInSbTe is mainly used as the material of the PCM layer 2. Furthermore, the PCM layer 2 employs a chalcogenide having chalcogen elements (S, Se and Te) as main ingredients and, in detail, employs a germanium antimony tellurium alloy (Ge2Sb2Te5) formed of Ge—Sb—Te.

FIGS. 2A and 2B are diagrams illustrating a principle of the PCR element shown in FIG. 1.

As shown in FIG. 2A, if low current less than a threshold value flows through the PCR element 4, the temperature of the PCM layer 2 becomes suitable for crystallization of the PCM layer 2. Accordingly, the PCM layer 2 enters a crystalline phase and is thus changed to a material of a low resistance phase.

Alternatively, as shown in FIG. 2B, if high current of the threshold or more flows through the PCR element 4, the temperature of the PCM layer 2 reaches a melting point or more. Accordingly the PCM layer 2 enters an amorphous phase and is thus changed to a material of a high resistance phase.

In this way, the PCR element 4 may nonvolatilely store data corresponding to two resistance phases. That is, the PCR element 4 is in a low resistance phase that refers to data '1' and in a high resistance phase that refers to data "0" and thus two data logic states may be stored.

FIG. 3 is a diagram illustrating a memory cell array formed of PCR elements of FIG. 1.

The memory cell array includes unit memory cells MC at junctions between bit lines BL and word lines WL. Each unit memory cell MC includes a PCR element and a cell switch. In this regard, the cell switch may be formed as a diode D. The diode D is made of a PN diode element.

One side electrode of the PCR element is coupled with a bit line BL, and the other electrode thereof is coupled to a P-type region of a diode D. An N-type region of the diode D is coupled to a word line WL.

In the cell array, during a write operation, a low voltage for example, a ground voltage VSS is applied to a selected word line WL2, and a drive voltage Vd corresponding to write data is applied to a selected bit line BL2. In this case, unselected bit lines BL1 and BL3 enter a floating state, and unselected word lines WL1 and WL3 are maintained at a high voltage VPPX.

As described above, when voltages are applied to the selected word line WL2 and the bit line BL2, current flows in the memory cell MC disposed at the corresponding junction therebetween, whereby heat is generated. For example, a low-temperature heating state is made when low current flows for a predetermined time, so that the PCR element of the corresponding memory cell MC enters a crystal phases, that is, a set phase. Alternatively, a high-temperature heating state is created when high current flows for a predetermined time, so that the PCR element of the corresponding memory cell MC enters an amorphous phase, that is, a reset phase.

However, during the write operation, heat generated from a target memory cell affects adjacent memory cells. Consequently, iterated write operations on a certain memory cell may change data of adjacent memory cells and thus cause program disturbance.

As such, memory cells of a nonvolatile memory device may drift from a first-programmed state due to various effects. Such various effects may include program disturbance, read disturbance, charge drift, temperature drop, cumulative write/erase cycles, abrasion, and so forth. Therefore, a memory system including a nonvolatile memory device performs a rewrite operation of refreshing the existing cells or moves the data to new cells before the reliability of programmed data is degraded by the state drift of the memory cell.

SUMMARY

Various embodiments are directed to a memory system capable of enhancing the reliability of data by reducing disturbance between adjacent regions caused by iterated write operations, and an operating method for the same In an embodiment a memory system may include: a memory device including one or more memory blocks, and configured to store data in a plurality of pages included in each memory block through a write operation; and a memory controller configured to count an operation number of write operations performed on the memory block, check whether the write operation is performed for each of the pages, select one or more victim pages among the pages, and copy data stored in the victim pages.

In an embodiment, an operating method for a memory system may include: first counting an operation number of write operations performed on one or more memory blocks included in a memory device; checking, among a plurality of pages included in each memory block, a page on which the write operation is performed; selecting, when the first counted operation number of write operations exceeds a first threshold value, one or more victim pages among the pages based on a result of the checking; and copying data stored in the selected victim pages.

BRIEF DESCRIPTION OF THE DRAWINGS

FIG. 5 is a diagram illustrating an operation of a memory controller shown in FIG. 4.

DETAILED DESCRIPTION

Figure 1:
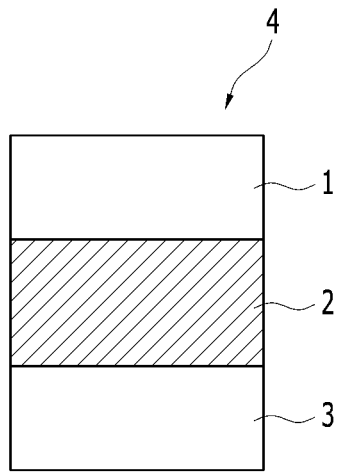
FIG. 1 is a diagram illustrating a phase change resistor (PCR) element constituting a PCRAM.
Figure 2A:
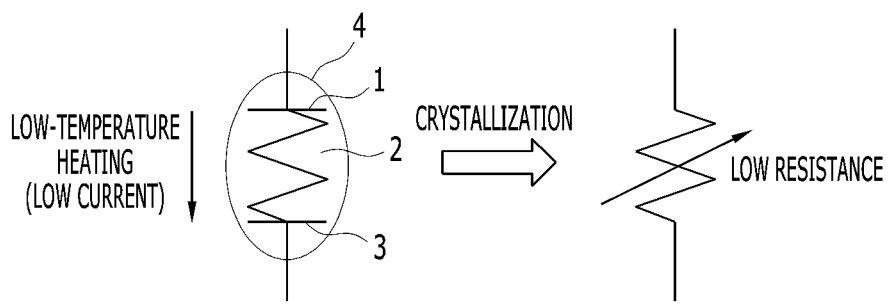
FIGS. 2A and 2B are diagrams illustrating a principle of the PCR element shown in FIG. 1.
Figure 2B:
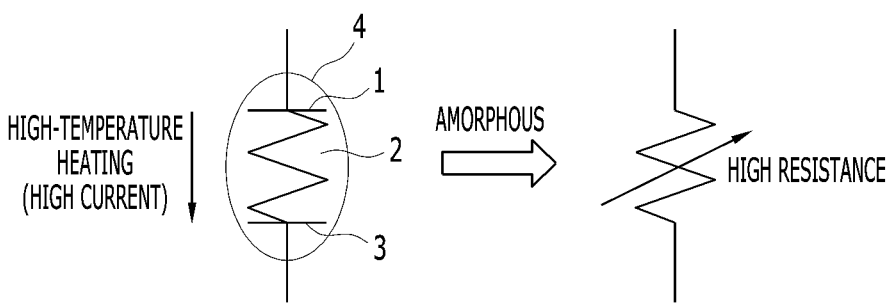
Figure 3:
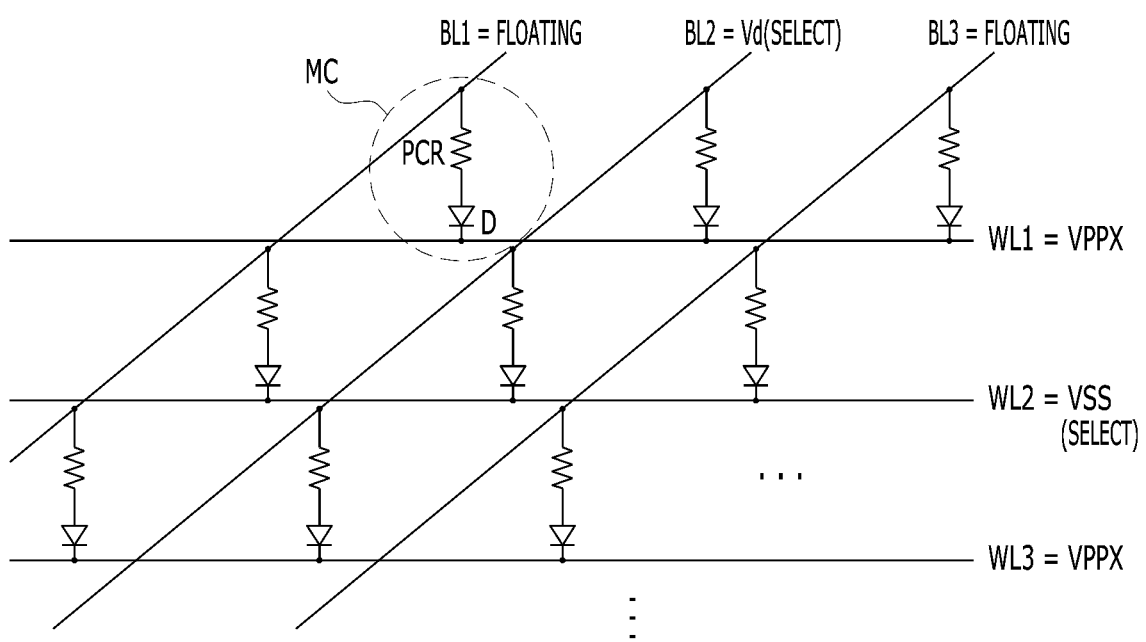
FIG. 3 is a diagram illustrating a memory cell array formed of PCR elements shown in FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 4:
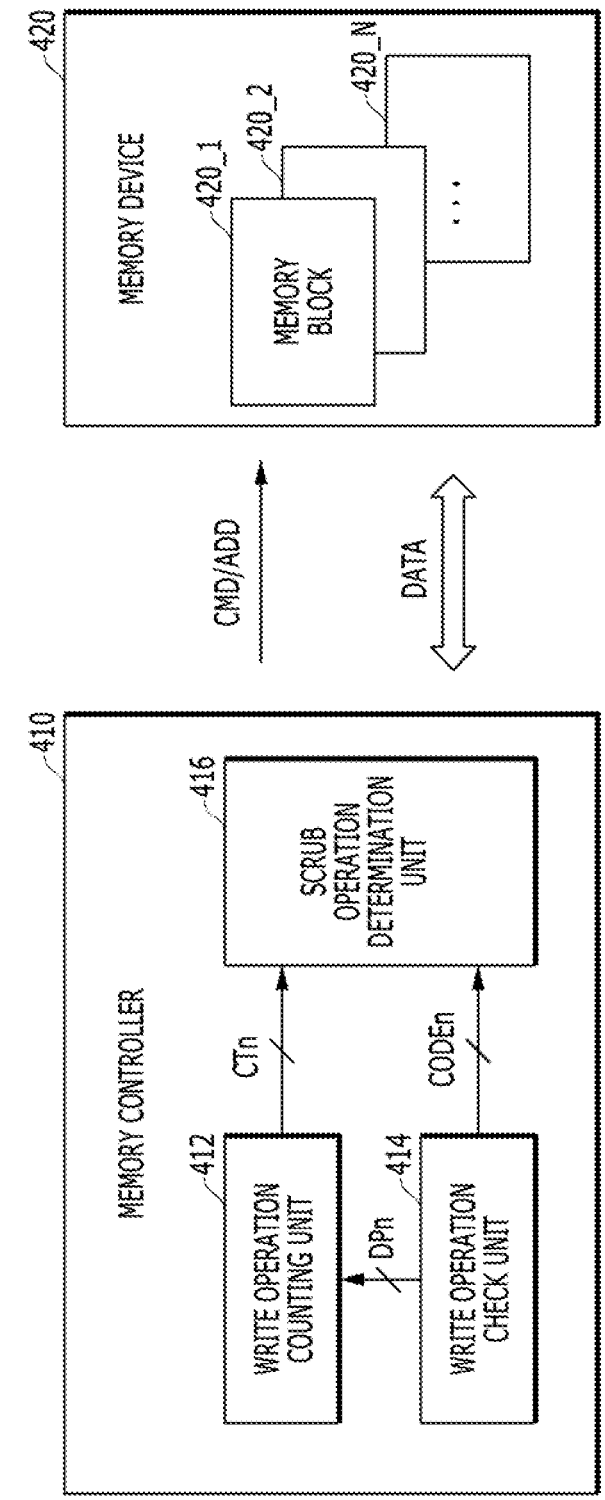
FIG. 4 is a block diagram illustrating a memory system accordance with an embodiment.

FIG. 4 is a block diagram illustrating a memory system 400 in accordance with an embodiment.

Referring to FIG. 4, the memory system 400 may include a memory controller 410 and a memory device 420, and may be operated in response to a request of a host (not shown). Particularly, the memory system 400 may store data. DATA to be accessed by the host. That is, the memory system 400 may be used as a main memory device or auxiliary memory device of the host.

The memory device 420 of FIG. 4 may include a PCRAM. However, the present disclosure is not limited to this, and may include a nonvolatile memory such as an MRAM, a RRAM, and an FRAM. That is, the memory device 420 may retain stored data even when power is not supplied thereto. The memory device 420 stores data DATA provided from the host through a write operation, and provides stored data DATA to the host through a read operation.

The memory device 420 includes a plurality of memory blocks 420_1 to 420_N, and each of the memory blocks 420_1 to 420_N includes a plurality of memory cells coupled to word lines WL. For example, a memory cell group coupled to one word line may be defined as one page, and the write or read operation of the memory device 420 may be performed on a page basis.

According to an embodiment, the memory controller 410 controls the general operation of the memory device 420 in response to a request from the host. For example, the memory controller 410 stores data DATA provided from the host, in the memory device 420, and provides data DATA read from the memory device 420, to the host. For this, the memory controller 410 controls operations such as a write operation, a read operation and an erase operation of the memory device 420. In addition, the memory controller 410 may perform a background operation such as a scrub operation with respect to the memory device 420. As a requirement for high integration of the memory device 420 is increased, it becomes common that a plurality of memory blocks 420_1 to 420_N included in the memory device 420 are formed of multi-level cells.

However, as described above, data of the memory cells may be corrupted by disturbance attributable to interference between word lines or memory cells during a write operation. To prevent this, the memory controller 410 may sense pages having high probability of disturbance based on an operation number of write operations performed to respective memory blocks 420_1 to 420_N or respective pages of each of the memory blocks 420_1 to 420_N. The sensed pages are selected as victim pages, and data stored in the victim pages may be refreshed or rewritten. Such an operation of the memory controller 410 may be hereinafter referred to as a scrub operation.

As shown in FIG. 4, the memory controller 410 in accordance with an embodiment may include a write operation counting unit 412, a write operation check unit 414, and a scrub operation determination unit 416.

The write operation counting unit 412 of the memory controller 410 may count the operation number of write operations performed to each of the memory blocks 420_1 to 420_N. The write operation counting unit 412 may compare the counted operation number of write operations with a first threshold value and output a plurality of count signals CTn respectively corresponding to the memory blocks 420_1 to 420_N.

That is, if the counted operation number of write operations to one among the memory blocks 420_1 to 420_N exceeds the first threshold value, the write operation counting unit 412 may enable one among the count signals CTn corresponding to the memory block whose operation number of write operations exceeds the first threshold value. For example, if a counted operation number of write operations performed to the first memory block 420_1 exceeds the first threshold value, the write operation counting unit 412 may enable a first count signal CT1 corresponding to the first memory block 420_1. In this regard, the first threshold value may be less than an operation number of write operations that may cause a disturbance between adjacent word lines of the memory device 420.

The write operation check unit 414 of the memory controller 410 may generate a plurality of code values CODEn, each bit value of which indicates whether a corresponding page is a dirty page, to which a write operation is performed, in each of the memory blocks 420_1 to 420_N. The plurality of code values CODEn may correspond to the plurality of memory blocks 420_1 to 420_N, respectively, and bit values of each of the code values CODEn may respectively correspond to a plurality of pages included in a corresponding memory block. Each of the code values CODEn may be updated each time a write operation is performed to one or more pages in a corresponding one among the memory blocks 420_1 to 420_N.

For example, when a K number of pages are included in each of the memory blocks 420_1 to 420_N, the write operation check unit 414 may generate "N" numbers of code values CODEn[1:k] corresponding to the memory blocks 420_1 to 420_N, respectively. In this regard, when write operations are performed to first and third pages among pages included in the first memory block 420_1, the write operation check unit 414 may update first and third bit values of a first code value CODE1, the first code value CODE1 corresponding to the first memory block 420_1, and the first and third bit values respectively corresponding to the first and third pages of the first memory block 420_1. For example, the write operation check unit 414 may generate the first code value CODE1 to have bit values [101 . . . 0].

The scrub operation determination unit 416 may determine whether a scrub operation is performed based on the count signals CTn and the code values CODEn that are respectively outputted from the write operation counting unit 412 and the write operation check unit 414. When one among the count signals CTn is enabled, the scrub operation determination unit 416 may select, in a memory block corresponding to the enabled count signal, a page corresponding to an enabled bit value of the code values CODEn and an adjacent page as victim pages. The memory controller 410 may perform a scrub operation for the selected victim pages. Such a scrub operation will be described in more detail with reference to FIG. 5.

Furthermore, the write operation check unit 414 may generate a plurality of dirty page signals DPn respectively corresponding to the memory blocks 420_1 to 420_N based on code values CODEn. Each of the dirty page signals DPn may represent that a write operation is performed to the entire pages of corresponding one among the memory blocks 420_1 to 420_N. For example, when all bit values of a first code value CODE1 corresponding to the first memory block 420_1 are enabled (e.g. [111 . . . 1]), the write operation check unit 414 may enable a first dirty page signal DP1 corresponding to the first memory block 420_1.

In this case, the write operation check unit 414 may initialize the first code value CODE1 to have all bit values as disabled (e.g. [000 . . . 0]). For example, each bit value of the first code value CODE1 may be re-enabled according to a subsequent write operation to pages of the first memory block 420_1.

In an embodiment, in response to an enabled one among the dirty page signals DPn outputted from the write operation check unit 414, the write operation counting unit 412 may initialize the operation number of write operations regarding one related to the enabled dirty page signal DPn among the memory blocks 420_1 to 420_N.

In detail, the write operation counting unit 412 may count the operation number of write operations performed to the respective memory blocks 420_1 to 420_N during a time segment between enablement of corresponding dirty page signals DPn, and compare the counted operation number of write operations performed to the respective memory blocks 420_1 to 420_N with a second threshold value whenever the corresponding dirty page signals DPn are enabled. If the counted operation number of write operations performed on a memory block is the same as the second threshold value at the enablement of a related dirty page signal DPn, the write operation counting unit 412 may initialize the operation number of write operations. In this embodiment, the second threshold value may be a number of pages included in the memory block related to the enabled dirty page signal DPn. The enablement of a dirty page signal DPn means that the write operations have been performed to all of the pages in the memory block related to the enabled dirty page signal DPn. Further, the write operations are performed to the memory block related to the enabled dirty page signal DPn as many times as the number of pages that is, the second threshold value at the enablement of the dirty page signal DPn. Therefore, it may be regarded that the write operations have been evenly performed to all of the pages in the memory block related to the enabled dirty page signal DPn. The even write operations to all of the pages may reduce the probability of disturbance between adjacent pages, and thus all parameters may be initialized in order to prevent an unnecessary scrub operation.

FIG. 5 is a diagram illustrating the operation of the memory controller 410 shown in FIG. 4. Particularly, to describe a scrub operation which is performed by the memory controller 410, there is illustrated various combinations of the count signal CT, the code value CODE and the dirty page signal DP which are outputted from the write operation counting unit 412 and the write operation check unit 414.

The count signal CT, the code value CODE, and the dirty page signal DP shown in FIG. 5 may correspond to an arbitrary one among the memory blocks 420_1 to 420_N. Although there is illustrated in FIG. 5 an example in which the memory block includes eight pages, the present disclosure is not limited to this.

Referring to FIG. 5, the first and second cases CASE A and CASE B are the ones in which write operations have been performed on the memory block as many as the first threshold value for example, 1000 times. That is, if the write operation counting unit 412 enables the count signal CT to a high level H, the scrub operation determination unit 416 selects victim pages based on the code value CODE outputted from the write operation check unit 414.

The first case CASE A illustrates that the write operation check unit 414 has enabled third and fourth bit values of the code value CODE to a high level H. That is, write operations have been performed to third and fourth pages among the pages included in the memory block. In this case, the scrub operation determination unit 416 selects second to fifth pages, which are the pages that is, the third and fourth pages of the high level H and adjacent pages that is, the second and fifth pages thereof, as victim pages based on the code value CODE, and the memory controller 410 may perform a scrub operation for the second to fifth pages. Eventually, based on the code value CODE representing whether the write operations have been performed, the scrub operation may be performed both on pages on which write operation have been performed and on pages adjacent thereto.

Alternatively, the second case CASE B illustrates that the write operation check unit 414 has enabled all bit values of the code value CODE to a high level H. That is, it may be checked that write operations have been performed on all pages included in the memory block. Therefore, the scrub operation determination unit 416 selects all of first to eighth pages as victim pages based on the code value CODE, and the memory controller 410 may perform a scrub operation for the first to eighth pages.

The third or fourth case CASE C or CASE D of FIG. 5 illustrates the ones in which the operation number of write operations performed on the memory block is less than the first threshold value, but write operations have been performed on all of the pages included in the memory block. That is, as all bit values of the code value CODE are enabled, the write operation check unit 414 may enable a dirty page signal DP.

In this case, since the operation number of write operations performed on the memory block does not exceed the first threshold value, the write operation counting unit 412 disables the count signal CT to a low level L. Therefore, the memory controller 410 does not perform a scrub operation, and all bit values of the code value CODE are initialized, so that the write operations to be performed on the pages may be re-checked (CASE C and CASE D).

Furthermore, every time the dirty page signal DP is enabled, the write operation counting unit 412 may compare the operation number of write operations WRITE'# performed during a time segment between enablement of the dirty page signal DP with a second threshold value for example, eight times. That is, each time a write operation is performed to all of the pages in the memory block, the operation number of operations is compared with the number of pages in the memory block. When the operation number of write operations is the same as the number of pages (CASE D), the memory controller 410 may initialize all parameters. That is, since write operations are evenly performed to all of the pages, the probability of a disturbance is reduced. Therefore, not only the code value CODE but also the operation number of write operations and so forth may be initialized, whereby an unnecessary scrub operation may be prevented.

Figure 6:
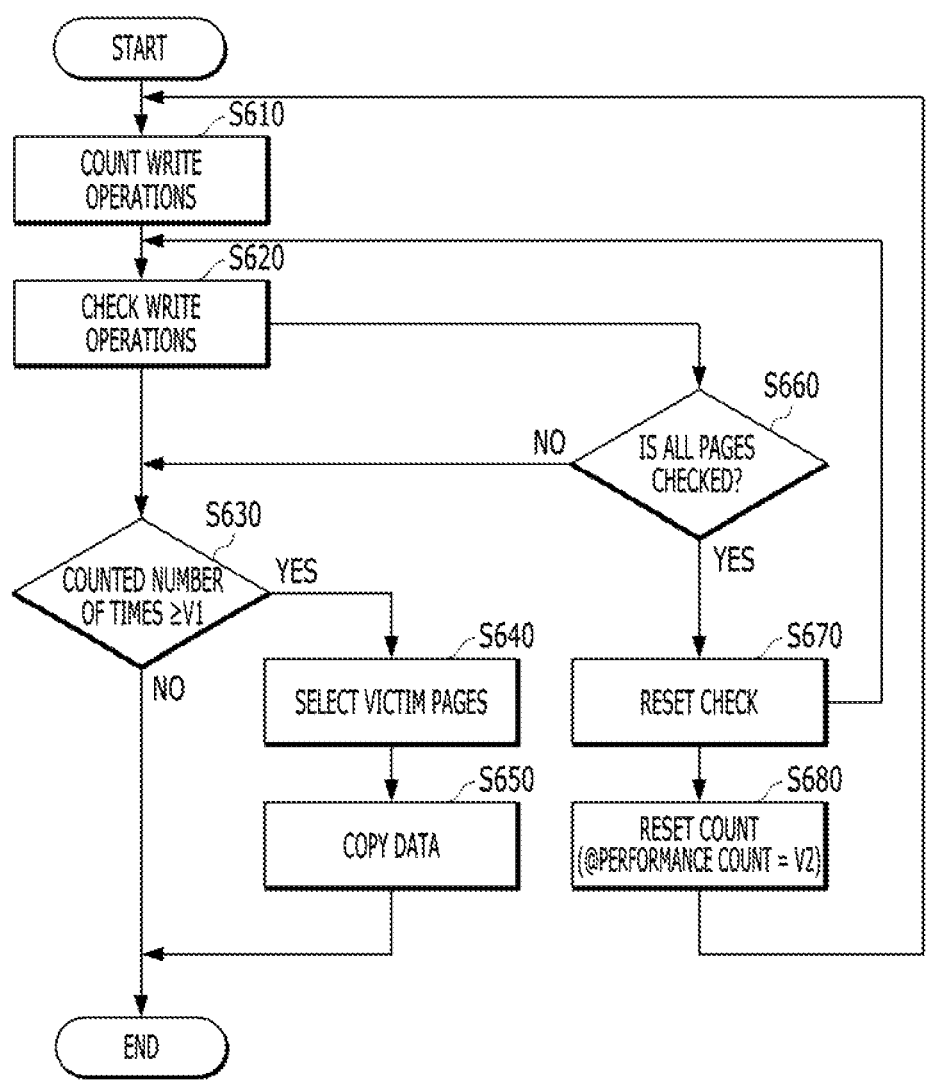
FIG. 6 is a flowchart illustrating an operation of the memory system of FIG. 4 in accordance with an embodiment.

FIG. 6 is a flowchart illustrating an operation of the memory system of FIG. 4 in accordance with an embodiment.

1) Count and check write operation (S610 and S620)

The memory controller 410 may count write operations performed in the memory device 420 and check whether the write operations are performed. In detail, the write operation counting unit 412 of the memory controller 410 may count the operation number of write operations performed to each of the plurality of memory blocks 420_1 to 420_N included in the memory device 420.

Furthermore, the write operation check unit 414 of the memory controller 410 may check whether a write operation to each of the pages of the memory blocks 420_1 to 420_N has been performed. That is, among the plurality of pages included in each of the memory blocks 420_1 to 420_N, a page to which a write operation is performed may be checked and managed.

2) Select a victim page and copy data (S640 and S650)

If the operation number of write operations that is counted at the write operation counting step S610 exceeds a first threshold value V1 (YES at step S630), victim pages are selected among a plurality of pages of a corresponding memory block, and data stored in the selected victim pages may be copied.

In detail, the write operation counting unit 412 of the memory controller 410 may compare the operation numbers of write operations of the respective memory blocks 420_1 to 420_N with the first threshold value V1. For a memory block of which the operation number of write operations exceeds the first threshold value V1 as a result of the comparison, the scrub operation determination unit 416 of the memory controller 410 may select pages for which write operations are checked by the write operation check unit 414 and pages adjacent thereto as victim pages. Consequently, the memory controller 410 may copy data stored in the victim pages and thus protect the data of memory cells in which disturbance may be caused during a write operation.

3) Check and count reset (S670 and S680)

As a result of the write operation check step S620, when it is determined that all pages included in one memory block are checked at step S660, the write operation check unit 414 may reset all checked pages and re-check whether write operations for the corresponding memory block are performed.

Furthermore, the write operation counting unit 412 may compare the second threshold value V2 with the operation number of write operations performed on the memory block while all pages are checked. If the operation number of write operations performed on the memory block while all of the pages are checked is the same as the second threshold value V2 as a result of the comparison, the write operation counting unit 414 may reset the operation number of write operations for the memory block and re-count from the beginning. That is, this represents that a write operation has been evenly performed to the pages, and thus means that disturbance due to a previously performed write operation may be offset. Therefore, all parameters may be initialized, and an unnecessary scrub operation may be prevented.

As described above, embodiments of the present disclosure are directed to reduce disturbance occurring between adjacent pages due to iterated write operations, and configured to perform a scrub operation in such a way that the operation number of write operations is counted for a memory block, and whether a write operation has been performed for each page included in the memory block is checked. Therefore, since a counting operation on a page basis is not needed, overhead in the operation or region of a memory controller may be reduced.

Furthermore, write operations which are performed evenly in the memory block may also offset disturbance due to a preceding write operation. Hence, cumulative values of parameters may be reset. Consequently, an unnecessary scrub operation may be prevented, whereby the lifespan of the memory device may be extended.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
    a memory device including one or more memory blocks, and configured to store data in a plurality of pages included in each memory block through a write operation; and
    a memory controller configured to count an operation number of write operations performed on each memory block and check whether a write operation is performed for each of the pages to generate a code value according to a result of the check, wherein the code value includes a plurality of bit values respectively corresponding to the pages in each memory block, each bit value being enabled when a write operation is performed to a corresponding page, wherein, when a memory block has the counted operation number of write operations exceed a first threshold value, the memory controller selects a page checked with the write operation being performed and a page adjacent to the checked page as one or more victim pages, among the pages of the memory block, and copies data stored in the victim pages, wherein the memory controller comprises:
- a write operation counting unit configured to first count the operation number of write operations performed on the memory block and enable a count signal when the first counted operation number of write operations exceeds the first threshold value;
- a write operation check unit configured to check whether the write operation is performed for each of the pages and output the code value according to the result of the check: and
- a scrub operation determination unit configured to determine whether a scrub operation is performed to the memory block based on the count signal and the code value.

2. The memory system of claim 1, wherein the scrub operation determination unit selects as the victim page, when the count signal is enabled, a page corresponding to an enabled bit value of the code value and a page adjacent thereto.

3. The memory system of claim 1, wherein, when all of the bit values of the code value are enabled, the write operation check unit initializes the enabled bit values and enables a dirty page signal.

4. The memory system of claim 3, wherein the write operation counting unit second counts the operation number of write operations performed while all of the bit values of the code value are enabled, and compares the second counted operation number of write operations with a second threshold value when the dirty page signal is enabled.

5. The memory system of claim 4, wherein, when the second counted operation number of write operations is the same as the second threshold value, the write operation counting unit initializes the first counted operation number of write operations.

6. The memory system of claim 5, wherein the second threshold value refers to the number of the pages included in the memory block.

7. An operating method for a memory system, comprising:
- first counting an operation number of write operations performed on one or more memory blocks included in a memory device;
- checking, among a plurality of pages included in each memory block, a page on which a write operation is performed to generate a code value according to a result of the checking, wherein the code value includes a plurality of bit values respectively corresponding to the pages in each memory block, each bit value being enabled when a write operation is performed to a corresponding page;
- selecting, when a memory block has the first counted operation number of write operations exceed a first threshold value, a page checked with the write operation being performed and a page adjacent to the checked page as one or more victim pages among the pages of the memory block, based on a result of the checking;
- copying data stored in the selected victim pages;
- second counting the operation number of write operations while all of the pages included in the memory block are checked as a result of the checking:
- comparing the second counted operation number of write operations with a second threshold value; and
- resetting the first counted operation number of write operations when the second counted operation number of write operations is the same as a second threshold value.

8. The operating method of claim 7, wherein the selecting of the victim pages comprises:
- comparing the first counted operation number of write operations with the first threshold value; and
- selecting, when the first counted operation number of write operations exceeds the first threshold value as a result of the comparing, the checked page and the page adjacent to the checked page as the victim pages.

9. The operating method of claim 7, further comprising, when all of the pages included in the memory block are checked as a result of the checking, resetting the result of the checking.

10. The operating method of claim 7, wherein the second threshold value refers to the number of the pages included in the memory block.

* * * * *